(12) United States Patent
Yu et al.

(10) Patent No.: US 12,419,057 B2
(45) Date of Patent: Sep. 16, 2025

(54) SEMICONDUCTOR DEVICE, INTEGRATED CIRCUIT AND METHOD OF MANUFACTURING THE SAME

(71) Applicant: TAIWAN SEMICONDUCTOR MANUFACTURING COMPANY LTD., Hsinchu (TW)

(72) Inventors: Chia-Jung Yu, Hsinchu (TW); Pin-Cheng Hsu, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 878 days.

(21) Appl. No.: 17/461,926

(22) Filed: Aug. 30, 2021

(65) Prior Publication Data
US 2023/0066392 A1    Mar. 2, 2023

(51) Int. Cl.
*H10B 61/00* (2023.01)
*H10N 50/01* (2023.01)
*H10N 50/10* (2023.01)
*H10N 50/80* (2023.01)

(52) U.S. Cl.
CPC ............ *H10B 61/22* (2023.02); *H10N 50/01* (2023.02); *H10N 50/10* (2023.02); *H10N 50/80* (2023.02)

(58) Field of Classification Search
CPC ........ H10B 61/22; H10B 61/20; H10B 63/30; H10B 63/34; H10N 50/80; H10N 50/10; H10N 50/01; H01L 27/22; H01L 43/08; H01L 43/02; H01L 43/12; H01L 23/528; H01L 27/092; H01L 21/00; H01L 21/8234; G11C 11/16; H10D 30/6732
See application file for complete search history.

(56) References Cited

U.S. PATENT DOCUMENTS

| | | | |
|---|---|---|---|
| 5,998,246 A * | 12/1999 | Huang | H10D 30/0321 257/E21.414 |
| 2009/0168493 A1* | 7/2009 | Kim | G11C 13/0069 257/E47.001 |
| 2017/0294520 A1* | 10/2017 | Lee | H01L 29/7869 |
| 2019/0371996 A1* | 12/2019 | Chuang | H10B 61/22 |
| 2019/0393249 A1* | 12/2019 | Lilak | H01L 27/0688 |
| 2020/0006638 A1* | 1/2020 | Chen | H10N 50/80 |
| 2020/0220024 A1* | 7/2020 | Sharma | H10D 62/83 |
| 2021/0264829 A1* | 8/2021 | Takatori | H10F 39/80377 |

\* cited by examiner

*Primary Examiner* — Moazzam Hossain
(74) *Attorney, Agent, or Firm* — WPAT LAW; Anthony King

(57) ABSTRACT

A semiconductor device, an integrated circuit, and a method of manufacturing the same are provided. The semiconductor device includes a substrate. At least two thin-film transistors (TFT) are disposed over the substrate and electrically coupled to each other in parallel and a magnetoresistive random-access memory (MRAM) cell electrically couples to the thin-film transistors.

20 Claims, 9 Drawing Sheets

SEMICONDUCTOR DEVICE, INTEGRATED CIRCUIT AND METHOD OF MANUFACTURING THE SAME

BACKGROUND

Many electronic devices contain electronic memory, such as hard disk drives or random access memory (RAM). Electronic memory may be volatile memory or non-volatile memory. Non-volatile memory is able to retain its stored data in the absence of power, whereas volatile memory loses its data memory contents when power is lost. A magnetic random access memory (MRAM) device is currently explored to facilitate a static random access memory (SRAM) to own a high non-volatile storage density. The MRAM device includes an array of densely packed MRAM cells. In each MRAM cell, a magnetic tunneling junction (MTJ) element is integrated with a transistor to perform write and read operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
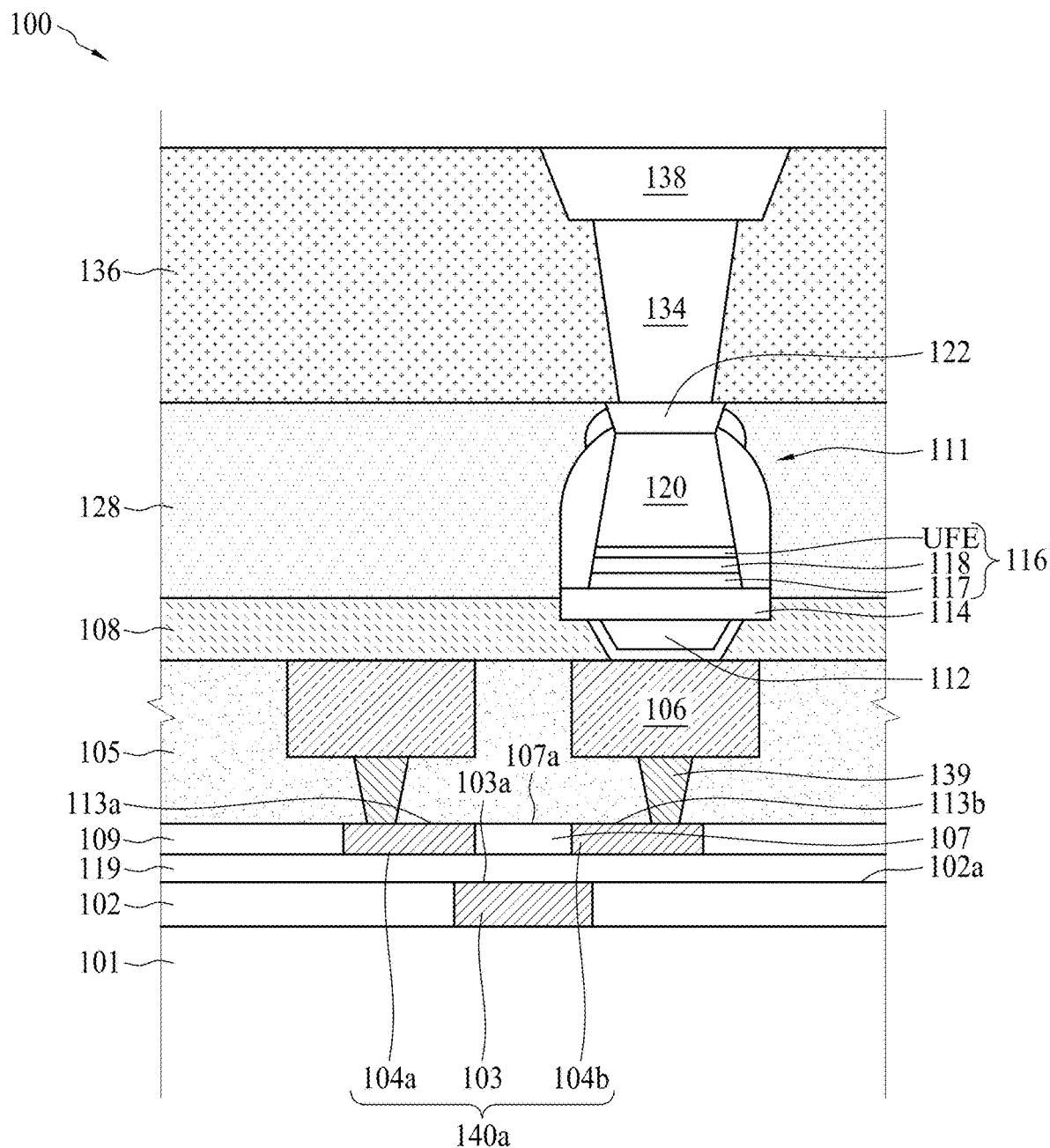
FIG. 1 illustrates a cross-sectional view of a memory device according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second," and "third" describe various elements, components, regions, layers and/or sections, these elements, components, regions, layers and/or sections should not be limited by these terms. These terms may be only used to distinguish one element, component, region, layer or section from another. The terms such as "first," "second," and "third" when used herein do not imply a sequence or order unless clearly indicated by the context.

As used herein, the terms "approximately," "substantially," "substantial," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to +10% of that numerical value, such as less than or equal to +5%, less than or equal to ±4%, less than or equal to ±3%, less than or equal to ±2%, less than or equal to ±1%, less than or equal to +0.5%, less than or equal to +0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±13%, less than or equal to +2%, less than or equal to ±1%, less than or equal to +0.5%, less than or equal to 0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to +3°, less than or equal to +2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to +2°, less than or equal to ±1, less than or equal to ±0.5°, less than or equal to 0.1°, or less than or equal to ±0.05°.

An integrated circuit (IC) often comprises a back-end-of-line (BEOL) interconnect structure and semiconductor devices on a front side of a semiconductor substrate. The semiconductor devices may include, for example, various n-type metal-oxide (NMOS) and/or p-type metal-oxide semiconductor (PMOS) devices, such as transistors, capacitors, resistors, diodes, photo-diodes, fuses, magnetic random access memory (MRAM) cells, and the like. The semiconductor devices may, for example, be in the BEOL interconnect structure, and/or between the semiconductor substrate and the BEOL interconnect structure. A technical problem may reside in how to provide sufficient power to the semiconductor devices or how to reduce the power consumption thereof.

In view of the foregoing, the present disclosure is directed to an IC, where semiconductor devices, such as MRAM cells are arranged within a BEOL interconnect structure, of which at least one of the technical problems mentioned above may be resolved.

FIG. 1 illustrates a cross-sectional view of a memory device 100 according to some embodiments of the present disclosure. The memory device 100 includes a substrate 101, a thin-film transistor (TFT) 140a, and a magnetoresistive random-access memory (MRAM) cell 111.

The substrate 101 may be, for example, a bulk semiconductor substrate (e.g., a bulk silicon substrate) or a silicon-on-insulator (SOI) substrate, or a wafer. An SOI substrate may include a layer of a semiconductor material, such as silicon, formed on an insulator layer. The insulator layer may be, for example, a buried oxide layer or a silicon oxide layer. The insulator layer is provided on a substrate, typically, a silicon or glass substrate. Other substrates, such as a multi-layered or gradient substrate may also be used. The substrate 101 may include electrical devices such as various n-type metal-oxide (NMOS) and/or p-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, and the like.

The process forming the individual devices such as transistors, capacitors, resistors, diodes, photo-diodes, fuses, and the like within the substrate 101 may be collectively referred as the front-end-of-line (FEOL) process, which is the first portion of integrated circuit (IC) fabrication where the individual devices (transistors, capacitors, resistors, etc.) are patterned in a substrate (e.g., wafer). FEOL generally covers everything up to (but not including) the deposition of metal layers.

Following the FEOL process is the back-end-of-line (BEOL) process, which is the second portion of IC fabrication where the individual devices are interconnected with wiring or metal layers on the IC. The BEOL process generally begins when the first metal layer or $M_1$ is deposited on the wafer. It may include contacts, insulating layers, metal layers, and bonding sites for chip-package connections. As a result, one or more metal layers, $M_1$-$M_n$ may be formed over an interlayer dielectric (ILD) layer. A typical IC may include three or more metal layers, followed by a final passivation layer. The final passivation layer may be used for protecting the IC from mechanical abrasion during probe and packaging and to provide a barrier to contaminants. After the final passivation layer, the bonding pads for input/output will be formed, followed by a post-fabrication process such as wafer probe, die separation, and packaging. In more details, the BEOL process may include: adding a metal layer $M_n$, adding an intra metal dielectric (IMD) layer, making vias through the IMD layer to connect to lower metal layer contacts, and forming higher metal layer contacts connected to the vias.

The thin-film transistor (TFT) 140a may be disposed over a first ILD layer 102 disposed over the substrate 101 during the BEOL process. A portion of the TFT 140a may be disposed within the first ILD layer 102. The first ILD layer 102 may include a low dielectric constant (k value less than about 2.5) material. For example, the first ILD layer 102 may include, for example, an oxide, silicon dioxide ($SiO_2$), borophosphosilicate glass (BPSG), TEOS, spin-on glass (SOG), undoped silicate glass (USG), fluorinated silicate glass (FSG), high-density plasma (HDP) oxide, or plasma-enhanced TEOS (PETEOS).

The TFT 140a may include a gate electrode 103, a gate dielectric layer 119, and source/drain electrodes 104a, 104b. The TFT 140a may be polycrystalline silicon TFT or amorphous silicon TFT.

The gate electrode 103 is disclosed within the first ILD layer 102. In some embodiments, the gate electrode 103 has an upper surface 103a substantially coplanar with an upper surface 102a of the first ILD layer 102. The gate electrode 103 may include silicon, glass, plastic, or any other appropriate material, or may include a metal or any other appropriate conductive material. In some embodiments, the gate electrode 103 include a material selected from the group consisting of indium tin oxide (ITO), gallium zinc oxide (GZO), indium gallium zinc oxide (IGZO), indium gallium oxide (IGO), indium zinc oxide (IZO), indium oxide ($In_2O_3$), and a combination thereof. Also, a material used to form the gate electrode 103 may include a conductive metal selected from the group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), and a combination thereof.

The gate dielectric layer 119 is disposed over the first ILD layer 102. The gate dielectric layer 119 may include a material selected from the group consisting of silicon oxide ($SiO_2$), silicon nitride ($SiN_x$), zirconium oxide ($ZrO_2$), hafnium oxide ($HfO_2$), titanium oxide ($TiO_2$), tantalum oxide ($Ta_2O_5$), a barium-strontium-titanium-oxygen compound (Ba—Sr—Ti—O), a bismuth-zinc-niobium-oxygen compound (Bi—Zn—Nb—O), and a combination thereof.

The source/drain electrodes 104a, 104b are disposed over the gate dielectric layer 119. The source/drain electrodes 104a, 104b are separated from each other by an active layer 107 formed over the gate dielectric layer 119 above the gate electrode 103. The source/drain electrodes 104a, 104b may have an upper surface 113a, 113b substantially coplanar with an upper surface 107a of the active layer 107. The source/drain electrodes 104a, 104b may include the same material as that of the gate electrode 103. For example, the source/drain electrodes 104a, 104b may include a metal or any other appropriate conductive material. In some embodiments, the source/drain electrodes 104a, 104b include a material selected from the group consisting of indium tin oxide (ITO), gallium zinc oxide (GZO), indium gallium zinc oxide (IGZO), indium gallium oxide (IGO), indium zinc oxide (IZO), indium oxide ($In_2O_3$), and a combination thereof. Also, a material used to form the source electrode 104a and the drain electrode 104b may include a conductive metal selected from the group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), and a combination thereof.

The active layer 107 serves to form a channel allowing electrons to move therein between the source/drain electrodes 104a, 104b. The active layer 107 may comprise an oxide semiconductor including, for example, silicon, IGZO, ITZO, IZO, AGZO, or a combination thereof.

The MRAM cell 111 is electrically coupled to the TFT 140a. The MRAM cell 111 may be electrically coupled to the TFT 140a by a first metal line 112 disposed under the bottom electrode 114. In some embodiments, the MRAM cell 111 is electrically coupled to the TFT 140a through the first metal line 112, the first interconnect line 106, and the first conductive via 139.

A bit line (BL) may be electrically coupled to one end of the MRAM cell 111 by a second interconnect line 138 above the top electrode 120. In some embodiments, the MRAM cell 111 is electrically coupled to the BL through the second conductive via 122, the third conductive via 134, and the second interconnect line 138. A source line (SL) may be electrically coupled to an opposite end of the MRAM cell 111 through the TFT 140a. Thus, application of a suitable word line (WL) voltage to the gate electrode 103 of the TFT 140a electrically couples the MRAM cell 111 between the BL and the SL. Consequently, by providing suitable bias conditions, the MRAM cell 111 can be switched between two states of electrical resistance, a first state with a low-resistance and a second state with a high-resistance, to store data. The MRAM cell 111 may be disposed within an interlayer dielectric (ILD) layer 128 over the substrate 101. The MRAM cell 111 may include a bottom electrode 114, a magnetic tunnel junction (MTJ) 116, and a top electrode 120.

A portion of the bottom electrode 114 may be disposed in a dielectric layer 108 over the substrate 101. The bottom electrode 114 may include, for example, tantalum, tantalum nitride, or ruthenium.

The MTJ 116 may be disposed adjacent to the bottom electrode 114. In some embodiments, the MTJ 116 is disclosed on the bottom electrode 114. The MTJ 116 may include a lower ferromagnetic electrode 117 and an upper ferromagnetic electrode UFE, which may be separated from each other by a tunneling barrier layer 118. In some embodiments, the lower ferromagnetic electrode 117 has a fixed or "pinned" magnetic orientation, while the upper ferromagnetic electrode UFE has a variable or "free" magnetic orientation, which may be switched between two or more distinct magnetic polarities that each represents a different data state, such as a different binary state. A "fixed" ferromagnetic layer refers to one having a magnetic orientation that is "fixed." A "free" ferromagnetic layer refers to one that is capable of changing its magnetic orientation between two magnetic states. If the magnetic orientations of the pinned ferromagnetic electrode 117 and the free ferromagnetic electrode UFE are in a parallel orientation, it is more likely that electrons will tunnel through the tunneling barrier layer 118, so the MTJ 116 is in a low-resistance state. Conversely, if the magnetic orientations of the pinned ferromagnetic electrode 117 and the free ferromagnetic electrode UFE are in an anti-parallel orientation, it is less likely that electrons will tunnel through the tunneling barrier layer 118, so the MTJ 116 is in a high-resistance state. Because of this binary nature, the MTJ 116 may be used in memory cells to store digital data, with the low-resistance state corresponding to a first data state (e.g., logical "0") and the high-resistance state corresponding to a second date state (e.g., logical "1"). In some embodiments, the MTJ may be vertically "flipped" such that the lower magnetic electrode 117 has a "free" magnetic orientation, while the upper ferromagnetic electrode UFE has a "pinned" magnetic orientation. In some embodiments, the lower ferromagnetic electrode 117 includes iron, cobalt, nickel, iron cobalt, nickel cobalt, cobalt iron boride, iron boride, iron platinum, iron palladium, or the like. In some embodiments, the upper ferromagnetic electrode UFE includes iron, cobalt, nickel, iron cobalt, nickel cobalt, cobalt iron boride, iron boride, iron platinum, iron palladium, or the like.

The tunneling barrier layer 118 provides electrical isolation between the upper ferromagnetic electrode UFE and the lower ferromagnetic electrode 117, while still allows electrons tunnel through under proper conditions. The tunneling barrier layer 118 may include, for example, magnesium oxide, aluminum oxide (e.g., $Al_2O_3$), nickel oxide, gadolinium oxide, tantalum oxide, molybdenum oxide, titanium oxide, tungsten oxide, or the like.

The top electrode 120 electrically couples the second conductive via to the MTJ 116. The top electrode 122 may include, for example, tantalum, tantalum nitride, or ruthenium.

Compared to current non-volatile memory, such as flash random-access memory, MRAM typically is faster and has better endurance. Compared to current volatile memory, such as dynamic random-access memory (DRAM) and static random-access memory (SRAM), MRAM typically has similar performance and density, but lower power consumption. Therefore, MRAM is one promising candidate for next generation non-volatile electronic memory due to advantages over current electronic memory. Since MRAM is preferably disposed in the BEOL interconnect structure, and/or between the semiconductor substrate and the BEOL interconnect structure, a TFT is preferably used to provide power to the MRAM as the BEOL process cannot perform a temperature as higher as in the FEOL process (the process temperature in the BEOL process is typically below 400° C.), which makes a TFT a better choice compared to other transistors to be electrically coupled to the MRAM as it can be made under the BEOL process temperature. Nevertheless, a disadvantage of this technology may be the low mobility and high contact resistance of the TFT.

In view of the foregoing, the present disclosure further provides the following embodiments that may resolve at least one of the problems mentioned above.

Figure 2A:
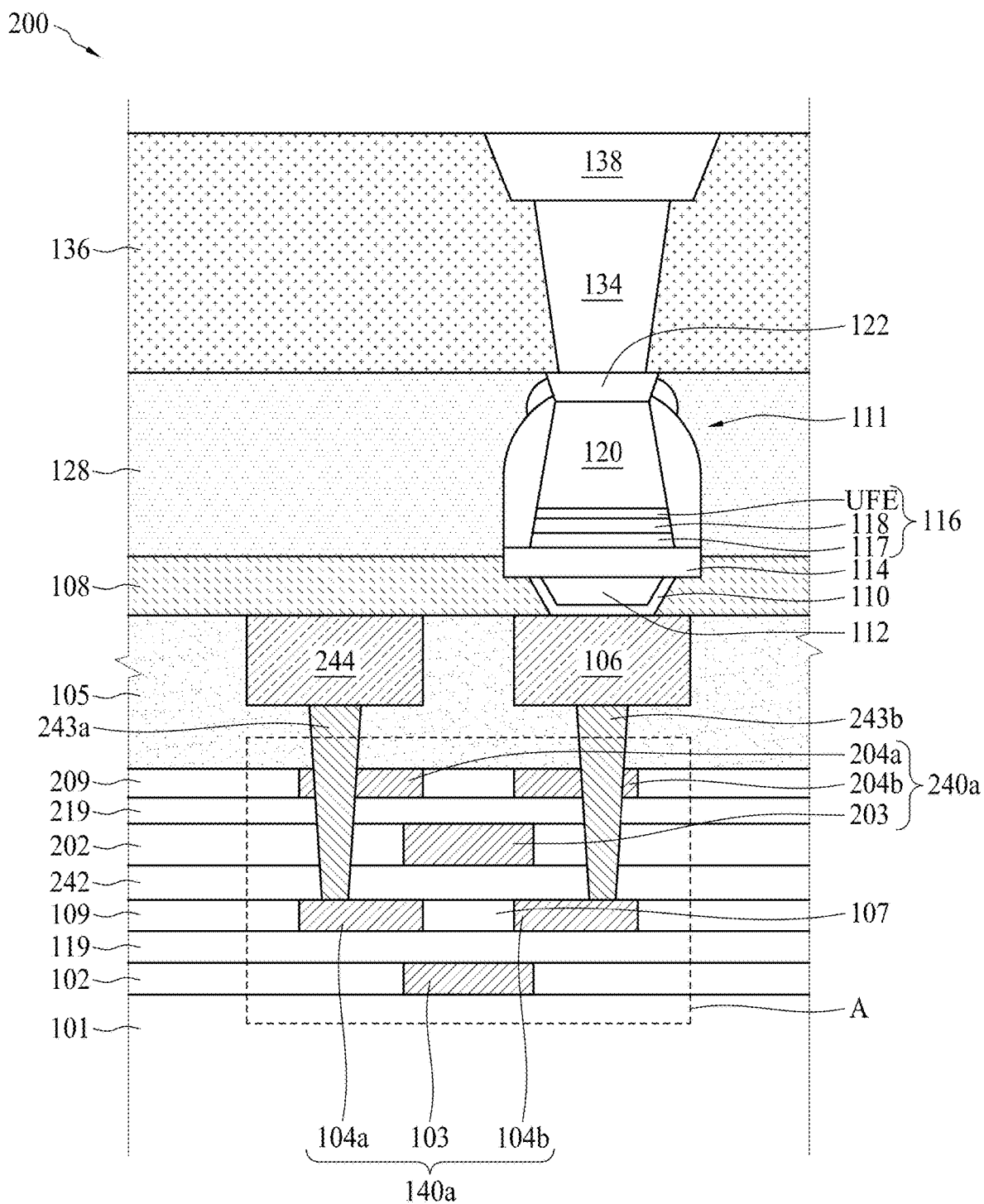
FIG. 2(a) illustrates a cross-sectional view of a memory device according to some embodiments of the present disclosure.
Figure 2B:
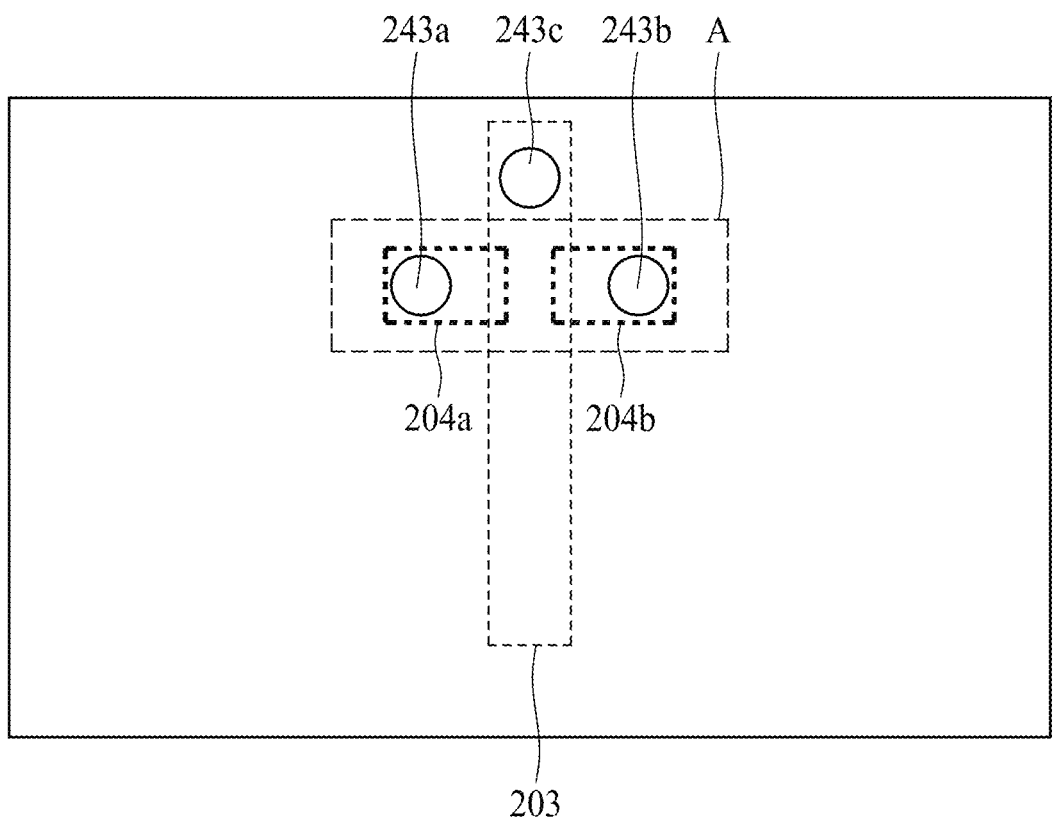
FIG. 2(b) illustrates a top view of region A of the memory device illustrated in FIG. 2(a) according to some embodiments of the present disclosure.

FIG. 2(a) illustrates a cross-sectional view of a memory device 200 according to some embodiments of the present disclosure. FIG. 2(b) illustrates a top view of region A of the memory device 200 illustrated in FIG. 2(a) according to some embodiments of the present disclosure. The memory device 200 illustrated in FIG. 2(a) is similar to that illustrated in FIG. 1 with a difference including that the MRAM cell 111 is electrically coupled to two TFTs 140a, 240a arranged in parallel and electrically connected to each other through a source/drain conductive via 243a, 243b and a gate conductive via 243c. In some embodiments, the TFTs 140a, 240a are disposed between the MRAM cell 111 and the substrate 101 in a BEOL structure. In some embodiments, the MRAM cell 111 is disposed between the TFTs 140a, 240a and the substrate 101 in a BEOL structure.

A second TFT 240a is electrically coupled to the first TFT 140a. The second TFT 240a is electrically coupled to the first TFT 140a in parallel so as to increase the current to the MRAM cell 111. In some embodiments, the second TFT 240a is disposed over the first TFT 140a. In some embodiments, the second TFT 240a and the first TFT 140a are stacked.

The source/drain conductive vias 243a, 243b electrically connect the first TFT 140a to the second TFT 240a. In some embodiments, the drain conductive via 243b electrically connects the first TFT 140a to the second TFT 240a and the first interconnect line 106, 244. In some embodiments, the source conductive via 243a electrically connects the first TFT 140a to the second TFT 240a and the first interconnect line 244. In some embodiments, the source/drain conductive vias 243a, 243b extend from the source/drain electrodes 104a, 104b of the first TFT to the source/drain electrodes 204a, 204b of the second TFT and the first interconnect lines 244, 106. A source line (SL) may be electrically coupled to an opposite end of the MRAM cell 111 through the first TFT 140a and the second TFT 240a by the drain conductive via 243b.

The gate conductive via 243c electrically connects the gate electrode 103 of the first TFT 140a to the gate electrode 203 of the second TFT 240a. In some embodiments, the gate conductive via 243c extends from the gate electrode 103 of the first TFT 140a to the gate electrode 203 of the second TFT 240a. A suitable word line (WL) voltage to the gate electrode 103 of the first TFT 140a electrically couples the MRAM cell 111 between the BL and the SL through the second TFT 240a.

By electrically connecting the first TFT 140a and the second TFT 240a in parallel by the drain conductive via 243b to the first interconnect line 106 electrically connected to the MRAM cell 111, the current flowing to the MRAM cell 111 may be increased. As a result, low current issue due to the low mobility and high contact resistance of a TFT transistor in a BEOL interconnect structure may be resolved and the MRAM cell 111 may thus receive sufficient power. In addition, the word line (WL) voltage that electrically couples the MRAM cell 111 between the BL and the SL may be reduced, which may in turn reduce the power consumption of the MRAM cell 111, and thus the semiconductor device.

The second TFT 240a may include a gate electrode 203, a gate dielectric layer 219, and source/drain electrodes 204a, 204b. The TFT 240a may be polycrystalline silicon TFT or amorphous silicon TFT.

The gate electrode 203 is disclosed within an ILD layer 202. The gate electrode 203 is similar to the gate electrode 103 of the first TFT 140a. For example, the gate electrode 203 may include silicon, glass, plastic, or any other appropriate material, or may include a metal or any other appropriate conductive material. In some embodiments, the gate electrode 203 include a material selected from the group consisting of indium tin oxide (ITO), gallium zinc oxide (GZO), indium gallium zinc oxide (IGZO), indium gallium oxide (IGO), indium zinc oxide (IZO), indium oxide ($In_2O_3$), and a combination thereof. Also, a material used to form the gate electrode 103 may include a conductive metal selected from the group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), and a combination thereof.

The gate dielectric layer 219 is disposed over the ILD layer 202 and the gate electrode 203. The gate dielectric layer 219 is similar to the gate dielectric layer 119 of the first TFT 140a. For example, the gate dielectric layer 219 may include a material selected from the group consisting of silicon oxide ($SiO_2$), silicon nitride ($SiN_x$), zirconium oxide ($ZrO_2$), hafnium oxide ($HfO_2$), titanium oxide ($TiO_2$), tantalum oxide ($Ta_2O_5$), a barium-strontium-titanium-oxygen compound (Ba—Sr—Ti—O), a bismuth-zinc-niobium-oxygen compound (Bi—Zn—Nb—O), and a combination thereof.

The source/drain electrodes 204a, 204b are disposed over the gate dielectric layer 219. The source/drain electrodes 204a, 204b are separated from each other by an active layer formed over the gate dielectric layer 219 above the gate electrode 203. The source/drain electrodes 204a, 204b are similar to those of the first TFT 140a. For example, the source/drain electrodes 204a, 204b may have an upper surface substantially coplanar with an upper surface of the active layer. For example, the source/drain electrodes 204a, 204b may include a metal or any other appropriate conductive material. In some embodiments, the source/drain electrodes 204a, 204b include a material selected from the group consisting of indium tin oxide (ITO), gallium zinc oxide (GZO), indium gallium zinc oxide (IGZO), indium gallium oxide (IGO), indium zinc oxide (IZO), indium oxide ($In_2O_3$), and a combination thereof. Also, a material used to form the source electrode 204a and the drain electrode 204b may include a conductive metal selected from the group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), and a combination thereof.

The active layer of the second TFT 240a is similar to those of the first TFT 140a. For example, the active layer of the second TFT 240a may comprise an oxide semiconductor including, for example, silicon, IGZO, ITZO, IZO, AGZO, or a combination thereof.

Figure 3:
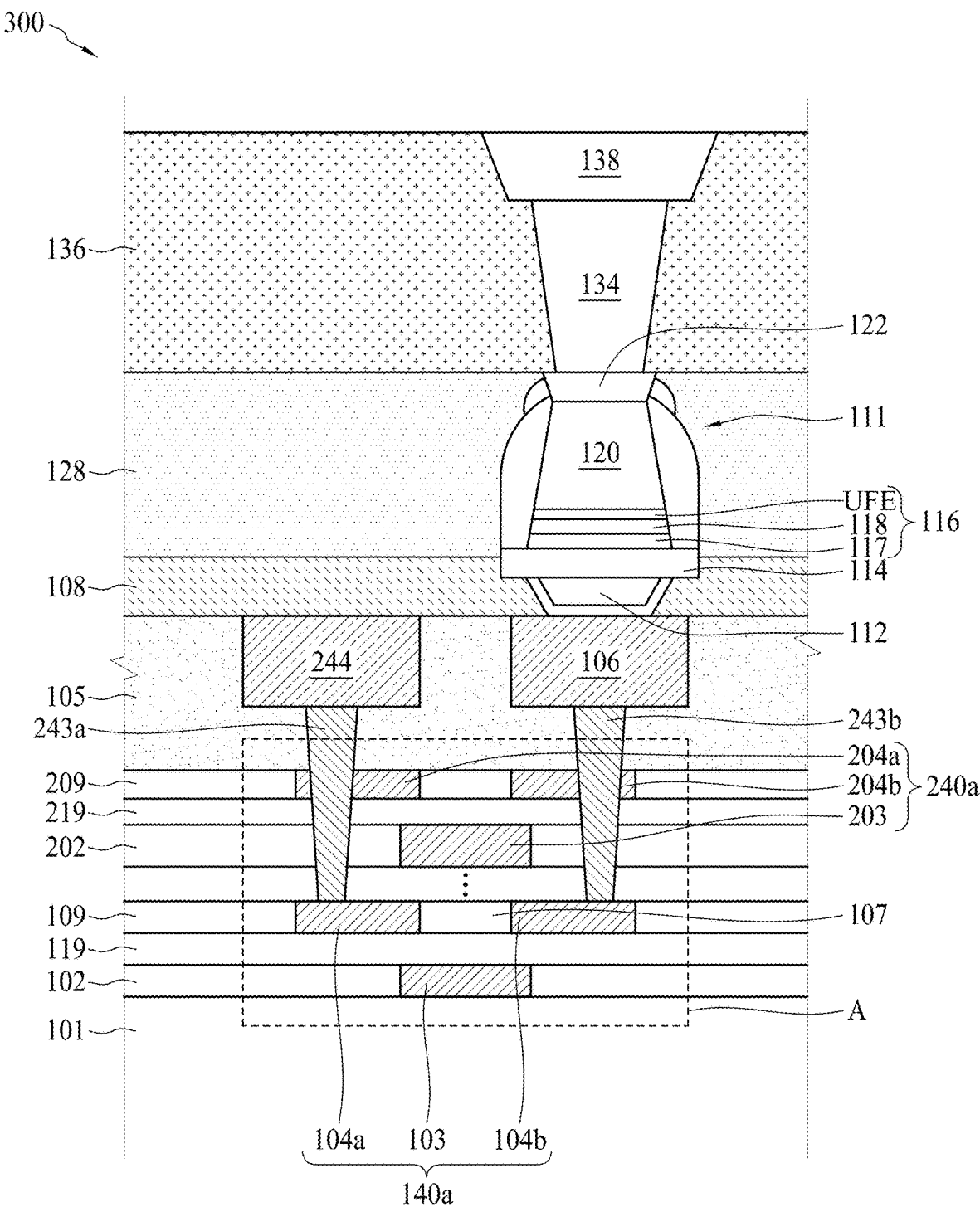
FIG. 3 illustrates a cross-sectional view of a memory device according to some embodiments of the present disclosure.

FIG. 3 illustrates a cross-sectional view of a memory device 300 according to some embodiments of the present disclosure. The memory device 300 illustrated in FIG. 3 is similar to that illustrated in FIG. 2 with a difference including that the MRAM cell 111 is electrically coupled to more than two TFTs 140a, 240a arranged in parallel and electrically connected to each other through a source/drain conductive via 243a, 243b and a gate conductive via.

By electrically connecting more TFTs to the MRAM cell 111 in parallel by the drain conductive via 243b, the current flowing to the MRAM cell 11l may be further increased. As a result, low current issue due to the low mobility and high contact resistance of a TFT transistor in a BEOL interconnect structure may be resolved and the MRAM cell 111 may thus receive sufficient power. In addition, the word line (WL) voltage that electrically couples the MRAM cell 111 between the BL and the SL may be further reduced, which may in turn further reduce the power consumption of the device.

Figure 4:
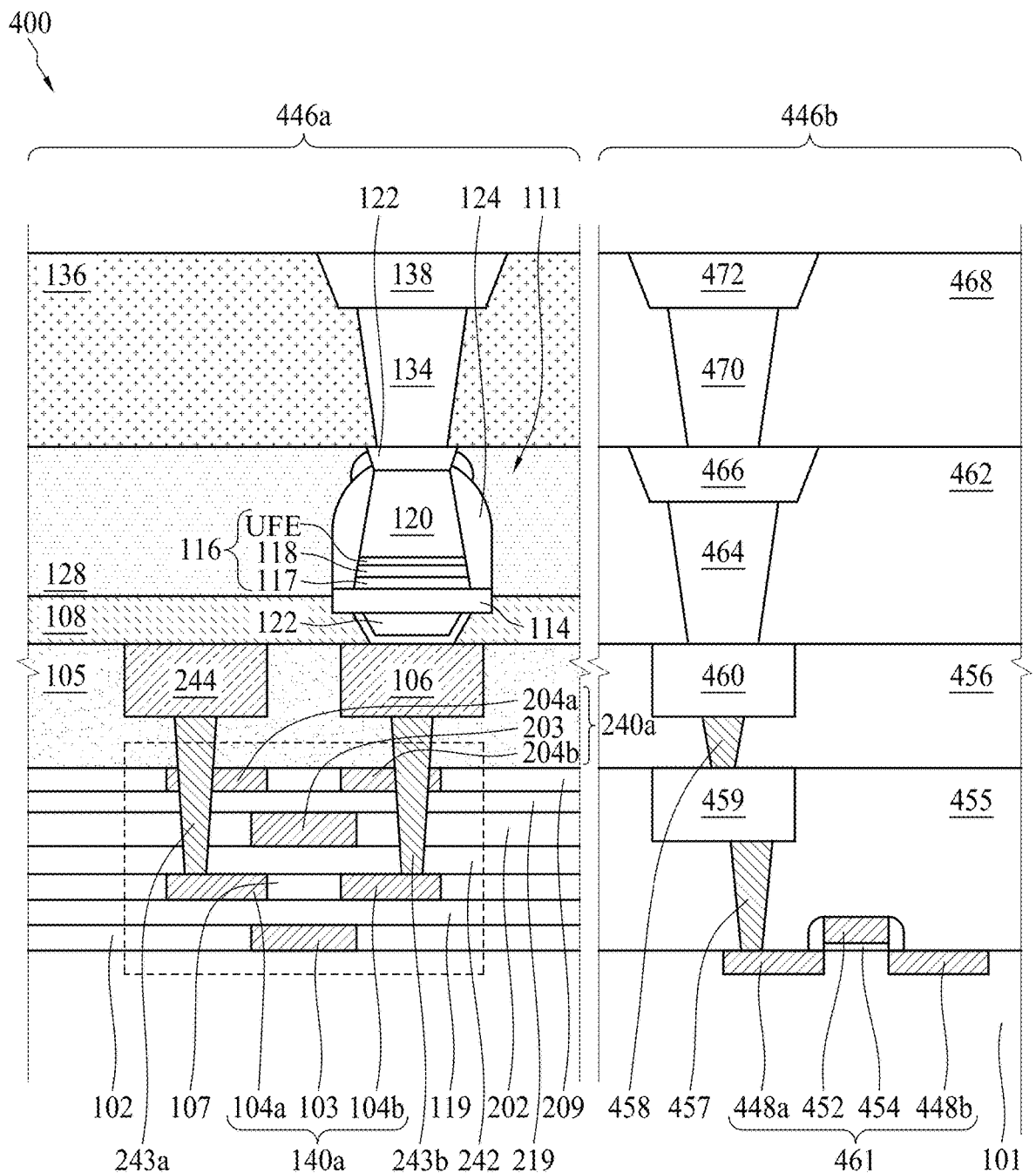
FIG. 4 illustrates a cross-sectional view of an integrated circuit according to some embodiments of the present disclosure.

FIG. 4 illustrates a cross-sectional view of an integrated circuit 400 according to some embodiments of the present disclosure. The integrated circuit 400 includes an embedded memory region 446a comprising a MRAM cell 111 electrically connected to two TFTs 240a, 140a and a logic region 446b.

The embedded memory region 446a is similar to that illustrated in FIG. 2 and is not described in details for brevity.

In the logic region 446b, a transistor 461 is disposed within the substrate 101 and the first ILD layer 455. The transistor 461 may include a gate electrode 452, a gate dielectric layer 454, and source/drain regions 448a, 448b. An interconnect line 459 electrically connects to the transistor 461 by a conductive via 457.

A second ILD layer 456, a third ILD layer 462, and a fourth ILD layer 468 may be disposed over the first ILD layer 455 sequentially, where each ILD layer 456, 462, 468 may include interconnect lines 460, 466, 472 and conductive vias 458, 464, 470 for electrically connecting the interconnect lines 460, 466, 472 to each other.

FIGS. 5A-5H illustrate a method of manufacturing a memory device such as the memory device of FIG. 2(a).

Figure 5A:
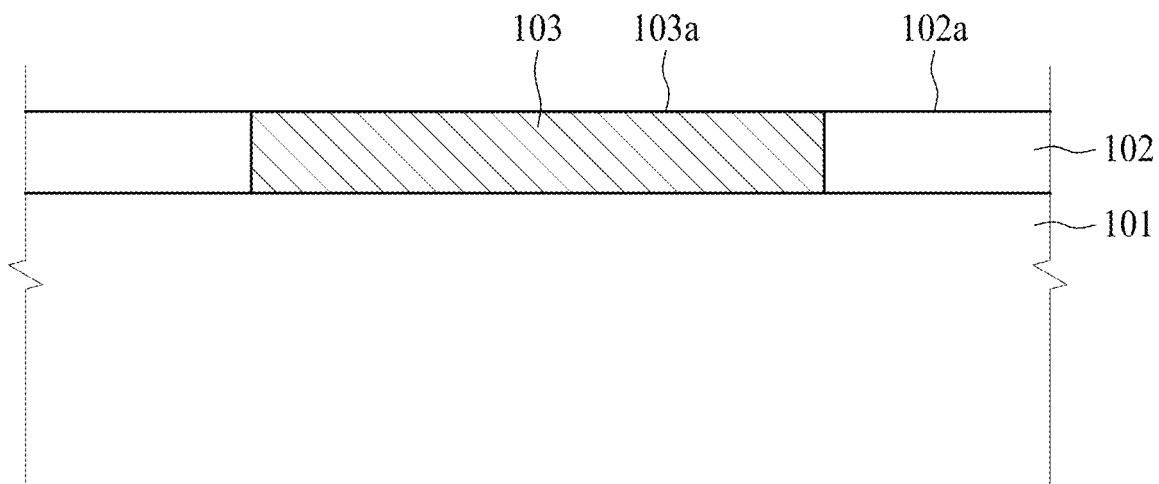
FIG. 5A, FIG. 5B, FIG. 5C, FIG. 5D, FIG. 5E, FIG. 5F, FIG. 5G, and FIG. 5H illustrate a method of manufacturing a memory device such as the memory device of FIG. 2(a) according to some embodiments of the present disclosure.

Referring to FIG. 5A, a first gate electrode 103 is disposed on a substrate 101 by performing a combination of a sputtering technology, a photolithography technology, and an etching technology with a conductive material. Subsequently, a first dielectric layer 102 having an upper surface 102a coplanar with an upper surface 103a of the first gate electrode 103 is deposited on the substrate 101 through a combination of a chemical vapor deposition (CVD) technology and a chemical-mechanical polishing (CMP) technology applied to a dielectric material.

Figure 5B:
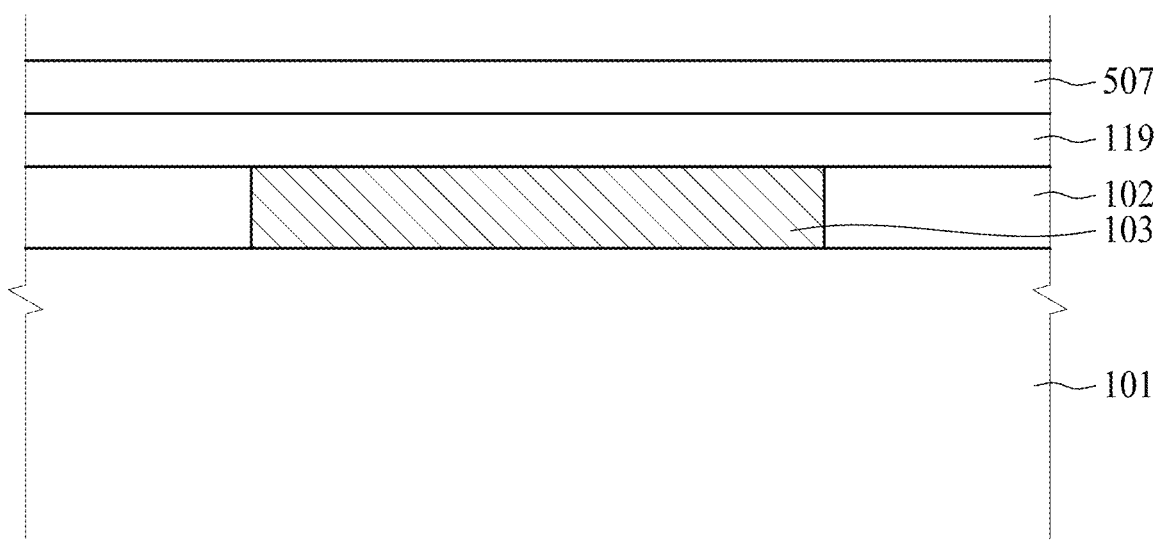

Referring to FIG. 5B, a first gate dielectric layer 119 is formed on the first gate electrode 103 and the first dielectric layer 102. The first gate dielectric layer 119 may be formed by a chemical vapor deposition (CVD) technology or any other suitable technologies. Subsequently, an oxide semiconductor material 507 is deposited on the first gate dielectric layer 119.

Figure 5C:
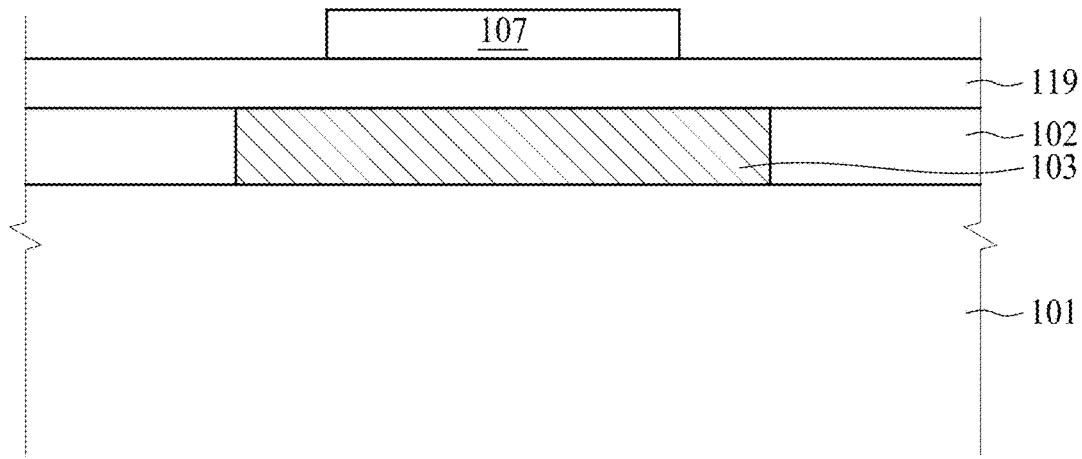

Referring to FIG. 5C, a first active layer 107 is formed on the first gate dielectric layer 119 through a combination of a photolithography technology and an etching technology applied to the oxide semiconductor material 507.

Figure 5D:
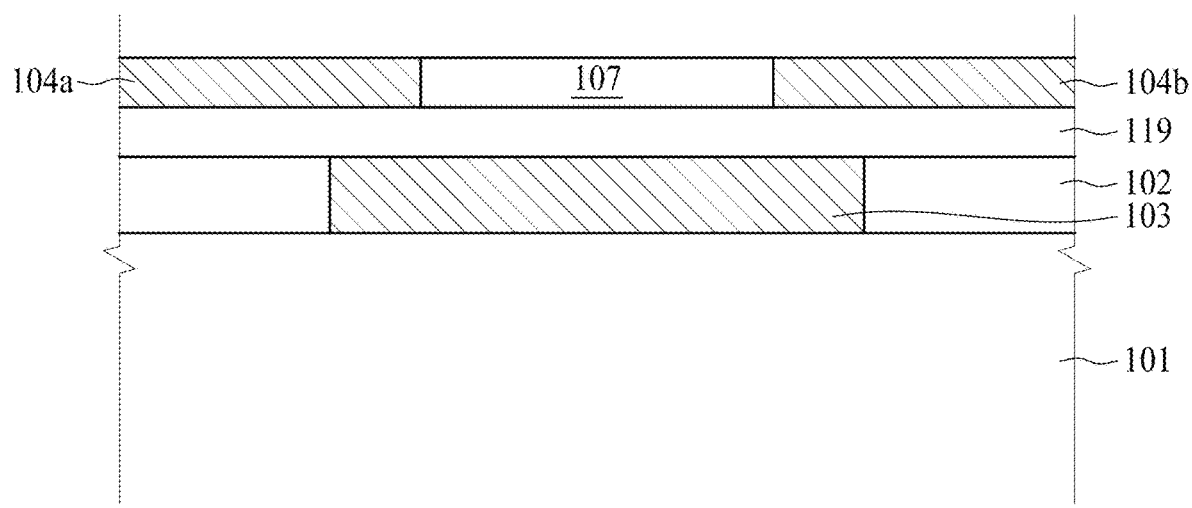

Referring to FIG. 5D, first source/drain electrodes 104a, 104b are formed on the first gate dielectric layer 119 and separated by the first active layer 107 through a combination of a sputtering technology and a chemical-mechanical polishing (CMP) technology.

Figure 5E:
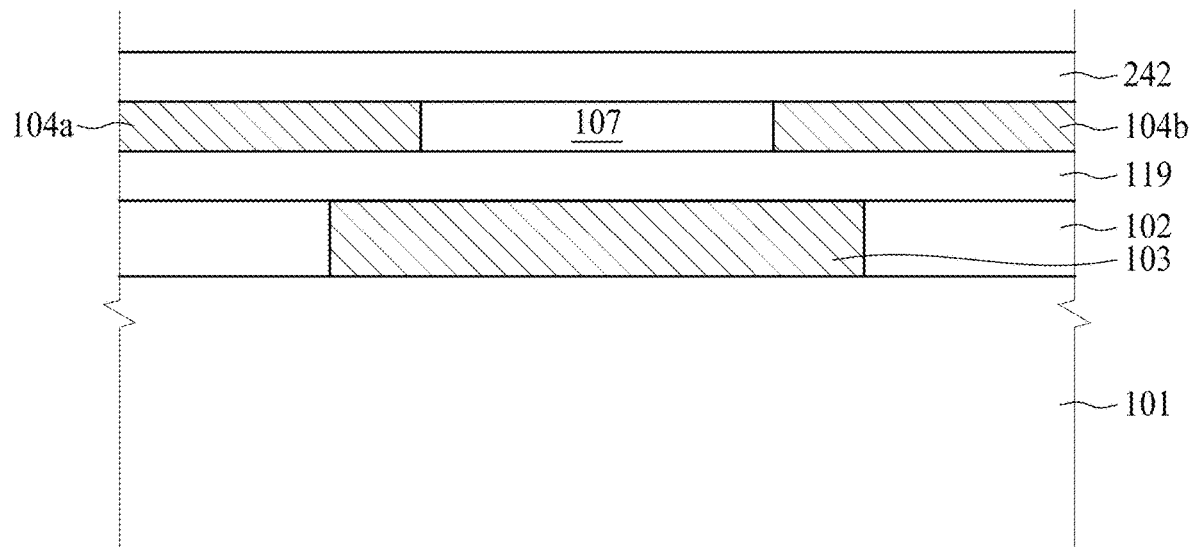

Referring to FIG. 5E, an inter-level dielectric layer 242 is formed on the first active layer 107 and the first source/drain electrodes 104a, 104b. The inter-level dielectric layer 242 may be formed by a chemical vapor deposition (CV D) technology or any other suitable technologies.

Figure 5F:
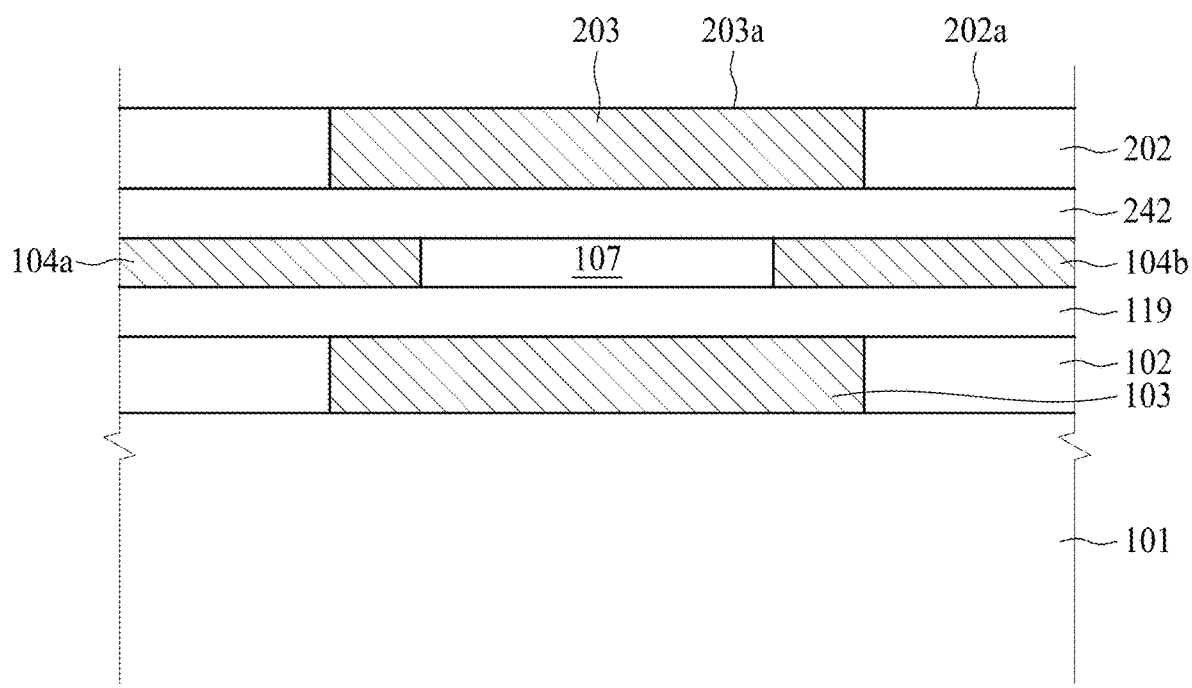

Referring to FIG. 5F, a second gate electrode 203 is disposed on the inter-level dielectric layer 242 by performing a combination of a sputtering technology, a photolithography technology, and an etching technology with a conductive material. Subsequently, a second dielectric layer 202 having an upper surface 202a coplanar with an upper surface 203a of the second gate electrode 203 is deposited on the inter-level dielectric layer 242 through a combination of a chemical vapor deposition (CVD) technology and a chemical-mechanical polishing (CM P) technology applied to a dielectric material.

Figure 5G:
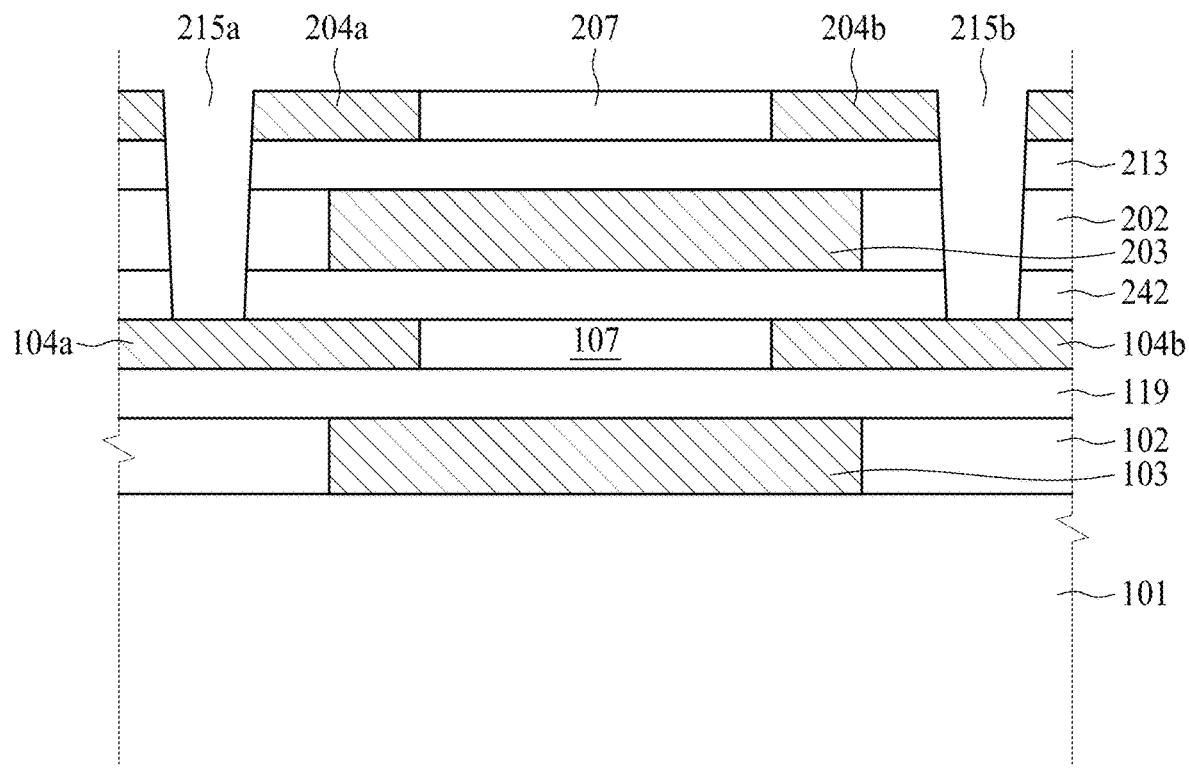

Referring to FIG. 5G, a second gate dielectric layer 219 is formed on the second gate electrode 203 and the second dielectric layer 202. The second gate dielectric layer 219 may be formed by a chemical vapor deposition (CV D) technology or any other suitable technologies. Subsequently, a second active layer 207 is formed on the second gate dielectric layer 219 through a combination of a photolithography technology and an etching technology. Subsequently, second source/drain electrodes 204a, 204b are formed on the second gate dielectric layer 219 and separated by the second active layer 207 through a combination of a sputtering technology and a chemical-mechanical polishing (CM P) technology.

Subsequently, a via 215a, 215b is disposed extending from the first source/drain electrodes 104a, 104b to the second source/drain electrodes 204a, 204b. The via 215a, 215b may be formed through a drilling technology (e.g., laser or mechanical drilling technology) or a combination of a photolithography technology and an etching technology.

Figure 5H:
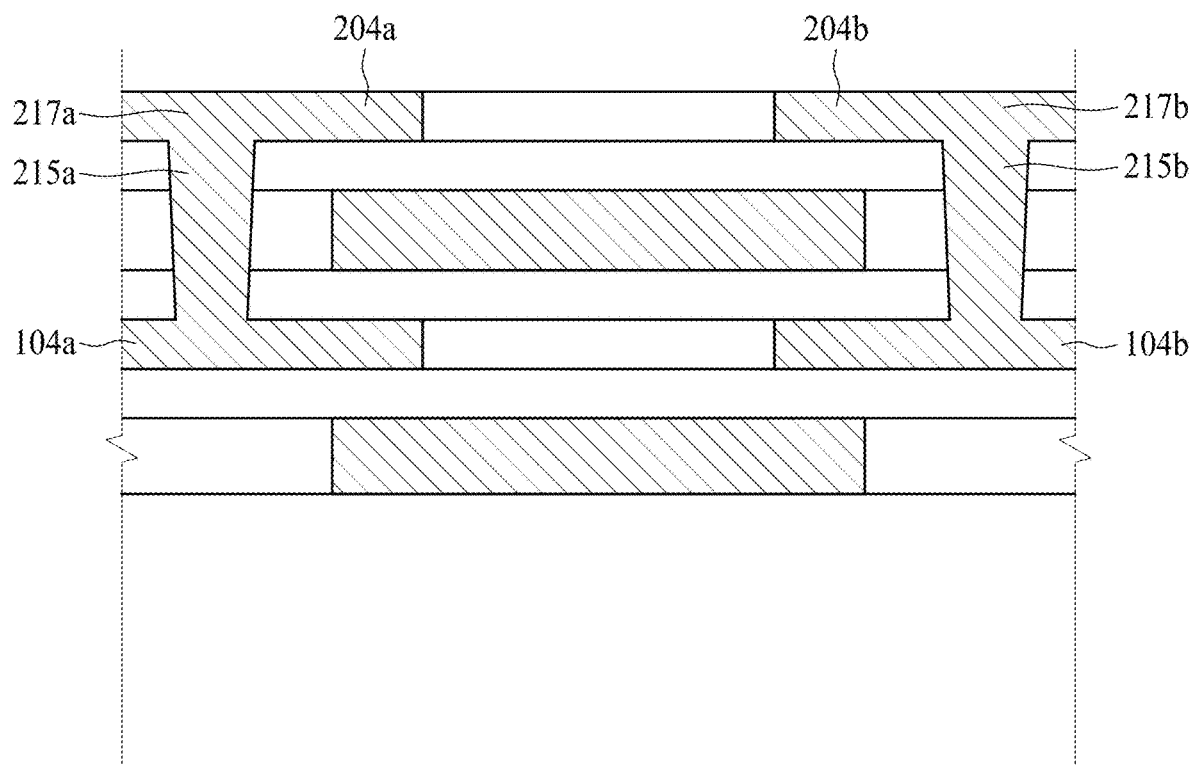

Referring to FIG. 5H, a conductive via 217a, 217b is formed by depositing a metal material into the via 215a, 215b through a combination of a sputtering technology and a chemical-mechanical polishing (CMP) technology. As a result, two TFTs electrically coupled to each other and arranged in parallel may be formed.

The steps mentioned above may be repeated depending on the amount of the TFTs to be formed. Afterwards, suitable technologies may be applied to dispose a MRAM cell electrically coupled to the TFTs. As a result, a memory device, such as the one illustrated in FIG. 2 may be obtained.

In some embodiments, a semiconductor device is provided. The semiconductor device includes a substrate. At least two thin-film transistors (TFT) are disposed over the substrate and electrically coupled to each other in parallel and a magnetoresistive random-access memory (MRAM) cell are electrically coupled to the thin-film transistors.

In some embodiments, an integrated circuit is provided. The integrated circuit includes a logic region and an embedded memory region. The logic region is disposed on a substrate. The embedded memory region includes at least two thin-film transistors (TFT) electrically coupled to each other in parallel and a magnetoresistive random-access memory (MRAM) cell is electrically coupled to the thin-film transistors.

In some embodiments, a method of manufacturing a semiconductor device is provided. The method includes disposing at least two thin-film transistors (TFT) adjacent to a substrate, where the thin-film transistors are electrically coupled to each other in parallel; and disposing a magnetoresistive random-access memory (MRAM) cell over the thin-film transistors, where the MRAM cell is electrically coupled to the thin-film transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   at least two thin-film transistors (TFT) disposed over the substrate and electrically coupled to each other in parallel, wherein a gate dielectric layer is formed on a gate electrode of each of the thin-film transistors, and source/drain electrodes of each of the thin-film transistors are formed on the gate dielectric layer, and the two TFTs include a first TFT and a second TFT over the first TFT, and an inter-level dielectric layer, on which the gate electrode of the second TFT is formed, covers and is in contact with the source/drain electrodes and a channel between the source/drain electrodes of the first TFT; and
   a magnetoresistive random-access memory (MRAM) cell electrically coupled to the thin-film transistors, wherein the second TFT is positioned between the MRAM cell and the first TFT.

2. The semiconductor device of claim 1, wherein the source/drain electrodes of the second TFT is positioned between the MRAM cell and the gate electrode of the second TFT.

3. The semiconductor device of claim 1, wherein the source/drain electrodes of the first TFT are aligned with the source/drain electrodes of the second TFT.

4. The semiconductor device of claim 3, wherein the second TFT is electrically coupled to the first TFT by a first conductive via extending from the drain electrode of the first TFT to the drain electrode of the second TFT.

5. The semiconductor device of claim 4, wherein the gate electrode of the second TFT is electrically coupled to the gate electrode of the first TFT by a second conductive via extending from the gate electrode of the first TFT to the gate electrode of the second TFT.

6. The semiconductor device of claim 1, further comprising an interlayer dielectric (ILD) layer disposed over the substrate, wherein the first TFT is disposed over the ILD layer, and an upper surface of the ILD layer is substantially coplanar with an upper surface of the gate electrode of the first TFT.

7. The semiconductor device of claim 1, further comprising an interlayer dielectric (ILD) layer disposed over the substrate, wherein the first TFT is disposed over the ILD layer, and an upper surface of an active layer of the first TFT is substantially coplanar with an upper surface of the source/drain electrodes of the first TFT.

8. The semiconductor device of claim 1, wherein the TFTs are disposed within a back-end-of-line (BEOL) interconnect structure.

9. An integrated circuit, comprising:
a logic region disposed on a substrate; and
an embedded memory region disposed over the substrate, comprising:
at least two thin-film transistors (TFT) electrically coupled to each other in parallel, wherein a gate dielectric layer is formed on a gate electrode of each of the thin-film transistors, and source/drain electrodes of each of the thin-film transistors are formed on the gate dielectric layer, and the two TFTs include a first TFT and a second TFT over the first TFT, and an inter-level dielectric layer, on which the gate electrode of the second TFT is formed, covers and is in contact with the source/drain electrodes and a channel between the source/drain electrodes of the first TFT; and
a magnetoresistive random-access memory (MRAM) cell electrically coupled to the thin-film transistors, wherein the second TFT is positioned between the MRAM cell and the first TFT.

10. The integrated circuit of claim 9, wherein the source/drain electrodes of the first TFT are aligned with the source/drain electrodes of the second TFT.

11. The integrated circuit of claim 10, wherein the second TFT is electrically coupled to the first TFT by a conductive via extending from the drain electrode of the first TFT to the drain electrode of the second TFT.

12. The integrated circuit of claim 11, wherein the gate electrode of the second TFT is electrically coupled to the gate electrode of the first TFT by a conductive via extending from the gate electrode of the first TFT to the gate electrode of the second TFT.

13. The integrated circuit of claim 9, further comprising an interlayer dielectric (ILD) layer disposed over the substrate, wherein the first TFT is disposed over the ILD layer, an upper surface of the ILD layer is substantially coplanar with an upper surface of the gate electrode of the first TFT, and an upper surface of an active layer of the first TFT is substantially coplanar with an upper surface of the source/drain electrodes of the first TFT.

14. The integrated circuit of claim 13, wherein the logic region comprises a transistor, and a portion of the transistor is within the ILD layer.

15. An integrated circuit, comprising:
a substrate;
an embedded memory region disposed over the substrate, comprising:
a first thin-film transistor (TFT);
a second TFT disposed over the first TFT and electrically coupled to the first TFT in parallel by a conductive via, wherein a gate dielectric layer is formed on a gate electrode of each of the first TFT and the second TFT, and source/drain electrodes of each of the first TFT and the second TFT are formed on the gate dielectric layer, and an inter-level dielectric layer, on which the gate electrode of the second TFT is formed, covers and is in contact with the source/drain electrodes and a channel between the source/drain electrodes of the first TFT; and
a magnetoresistive random-access memory (MRAM) cell electrically coupled to the first TFT and the second TFT, wherein the second TFT is positioned between the MRAM cell and the first TFT.

16. The integrated circuit of claim 15, wherein the embedded memory region further comprises an interconnect line disposed over the first TFT and the second TFT, wherein the conductive via electrically connects the first TFT to the second TFT and the interconnect line.

17. The integrated circuit of claim 16, wherein the MRAM cell is disposed over the interconnect line and comprises a bottom electrode electrically connected to the interconnect line through a metal line.

18. The integrated circuit of claim 16, wherein the embedded memory region further comprises an interlayer dielectric (ILD) layer over the interconnect line, and the MRAM cell comprises a bottom electrode partially in the ILD layer and electrically connected to the interconnect line.

19. The integrated circuit of claim 15, wherein the first TFT comprises a first drain electrode and a first source electrode at substantially a same elevation, and the second TFT comprises a second drain electrode vertically aligned with the first drain electrode and a second source electrode vertically aligned with the first source electrode.

20. The integrated circuit of claim 15, further comprising a logic region disposed on the substrate, wherein the logic region comprises a transistor disposed partially within the substrate.

* * * * *